United States Patent [19]
Sudo et al.

[11] Patent Number: 6,122,114
[45] Date of Patent: *Sep. 19, 2000

[54] OPTICAL-ELEMENT SUPPORTING DEVICE AND OPTICAL APPARATUS

[75] Inventors: Yuji Sudo; Norikazu Shigeno; Tetsuya Sekino; Tetsuya Furusawa, all of Utsunomiya, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/976,060
[22] Filed: Nov. 21, 1997

[30] Foreign Application Priority Data

Nov. 26, 1996 [JP] Japan .................................. 8-314902

[51] Int. Cl.⁷ ........................................... G02B 7/02
[52] U.S. Cl. .......................... 359/819; 359/820; 359/821; 359/822
[58] Field of Search .................................. 359/819, 811, 359/830, 820, 822, 821

[56] References Cited

U.S. PATENT DOCUMENTS 5,172,276 12/1992 Ueyama ................................... 359/813

FOREIGN PATENT DOCUMENTS 62-49116 3/1987 Japan .
4175709 6/1992 Japan .

*Primary Examiner*—Georgia Epps
*Assistant Examiner*—Michael A Lucas
*Attorney, Agent, or Firm*—Robin, Blecker & Daley

[57] ABSTRACT

An optical-element supporting device arranged to support and set one or a plurality of optical elements in respective predetermined positions in an optical axis direction, includes ring frames mounted respectively on the plurality of optical elements and each having a plurality of projections protruding in the optical axis direction, and a pinching structure for pinching the ring frames being piled up in the optical axis direction (the pinching structure comprising, for example, a lens barrel member which accommodates the ring frames mounted on the optical elements and leaf springs mounted near an end part of the lens barrel member in the optical axis direction), wherein the projections of the ring frames and respective pinching positions of the pinching structure are axially aligned in parallel with the optical axis direction.

17 Claims, 8 Drawing Sheets

OPTICAL-ELEMENT SUPPORTING DEVICE AND OPTICAL APPARATUS

BACKGROUND OF THE INVENTION

1. Field of the Invention

The present invention relates to a supporting device (lens barrel) which sets optical elements such as lenses, a mirror, etc., in their predetermined positions in the direction of the optical axis and to an optical apparatus such as a step-and-repeat-type projection aligner (stepper) having the supporting device, which is used for manufacturing a semiconductor device such as a semiconductor chip.

2. Description of Related Art

The supporting devices of the kind mentioned above include a lens barrel arranged to hold optical elements in the so-called lens-thrusting or lens-inserting manner. FIG. 8 shows by way of example the configuration of a lens-thrusting-type lens barrel. Referring to FIG. 8, lenses 38 jointly constitute a refraction-type projecting optical system. A lens barrel 39 is arranged to hold the lenses 38. The lenses 38 are ground beforehand so as to make their outside diameters coaxial to a prescribed degree with respect to the optical axis. The outside diameters of the lenses 38 are measured with a prescribed degree of precision. Lens-setting parts 38a, 38b and 38c formed on the inner circumferential side of the lens barrel 39 respectively according to the outside diameters of the corresponding lenses 38. The positions of the lens-setting parts 38a to 38c in the optical axis direction are set to have prescribed amounts of clearances between the lenses 38.

The lenses 38 are fixed in their positions by causing the lenses 38 to abut on angular parts of the lens-setting parts 38a to 38c and by screwing retaining rings 30 into threaded parts formed in the upper parts of the lens-setting parts 38a to 38c in such a way as to push the lenses 38 from above as shown in FIG. 8.

In the lens barrel 39, the lens-setting parts 38a to 38c are in direct contact with the lenses 38. However, the shapes of the lenses 38 seldom exactly coincide with those of the lens-setting parts 38a to 38c. The lenses 38, therefore, tend to be deformed by their own weight or by a pressing force of the retainer rings 30, according to the shapes of the lens-setting parts 38a to 38c. Such lens deformation has deteriorated the optical characteristics such as an aberration, etc., of the group of lenses 38.

To solve the above problem, it is conceivable to mount a holding frame (a holding member) on the peripheral part of each lens 38 and to cause the holding frame to abut on each of the lens-setting parts 38a to 38c. However, in cases where the lens barrel 39 is deformed by the excessive pressing force of the retaining rings 30 or by some external force applied to the lens barrel 39, the deformation of the lens barrel 39 tends to be transmitted to the lenses 38 through the holding frames. Therefore, the use of the holding frames is not said to be an apposite method for solving the problem in the case of an optical system where even a minute deformation presents a serious problem.

BRIEF SUMMARY OF THE INVENTION

It is an object of the invention to provide an optical-element supporting device, such as a lens barrel, arranged to be capable of supporting optical elements such as lenses without deforming the optical elements, and an optical apparatus such as a stepper or the like having the optical-element supporting device.

In accordance with a first aspect of the invention, there is provided an optical-element supporting device arranged to support and set one or a plurality of optical elements in respective predetermined positions in an optical axis direction, which comprises holding members mounted respectively on the plurality of optical elements and each having a plurality of projections protruding in the optical axis direction, and pinching means for pinching the holding members being piled up in the optical axis direction (the pinching means comprising, for example, a lens barrel member which accommodates the holding members mounted on the optical elements and a retaining member mounted near an end part of the lens barrel member in the optical axis direction), wherein the projections of the holding members and respective pinching positions of the pinching means are axially aligned in parallel with the optical axis direction.

In accordance with a second aspect of the invention, there is provided an optical-element supporting device arranged to support and set one or a plurality of optical elements in respective predetermined positions in an optical axis direction, which comprises holding members mounted respectively on the plurality of optical elements, spacer members piled up alternately with the holding members in the optical axis direction and having a plurality of projections protruding from both sides of the spacer members in the optical axis direction, and pinching means for pinching the holding members and the spacer members, wherein the projections of the spacer members and respective pinching positions of the pinching means are axially aligned in parallel with the optical axis direction.

More specifically, according to the invention, the deformation of the lens barrel member, etc., is prevented from being readily transmitted to the holding members by allowing contact of one of the holding members with another, contact of the holding members with the pinching means, contact of the holding members with the spacer members or contact of the spacer members with the pinching means only at three parts or thereabout in the circumferential direction of the lens barrel member, and the holding members are prevented from being deformed by being pinched by the pinching force of the pinching means, by aligning the contact positions (projections) in the direction in which the pinching means exerts its pinching force, i.e., in the optical axis direction. Accordingly, the optical elements are prevented from being deformed by any external force on the lens barrel member and by any great pinching force of the pinching means.

Further, in a case where the pinching means is formed by mounting a retaining member or members on the lens barrel member, a spring member is preferably employed as the retaining member. An amount of initial deformation of the spring member, i.e., the retaining member, is adjusted in such a way as to ensure a necessary pinching force even when the lens barrel member and the holding members are caused to expand or contract by changes in temperature.

The optical-element supporting device arranged as described above according to the invention enables an optical apparatus, such as a stepper or the like, to keep its optical characteristics little changed by deformation of optical elements. The invention permits semiconductor devices such as semiconductor chips or the like to be adequately manufactured by using such optical apparatus.

The above and other objects and features of the invention will become apparent from the following detailed description of preferred embodiments thereof taken in conjunction with the accompanying drawings.

DETAILED DESCRIPTION OF THE INVENTION

Hereinafter, preferred embodiments of the invention will be described in detail with reference to the drawings.

(First Embodiment)

Figure 1:
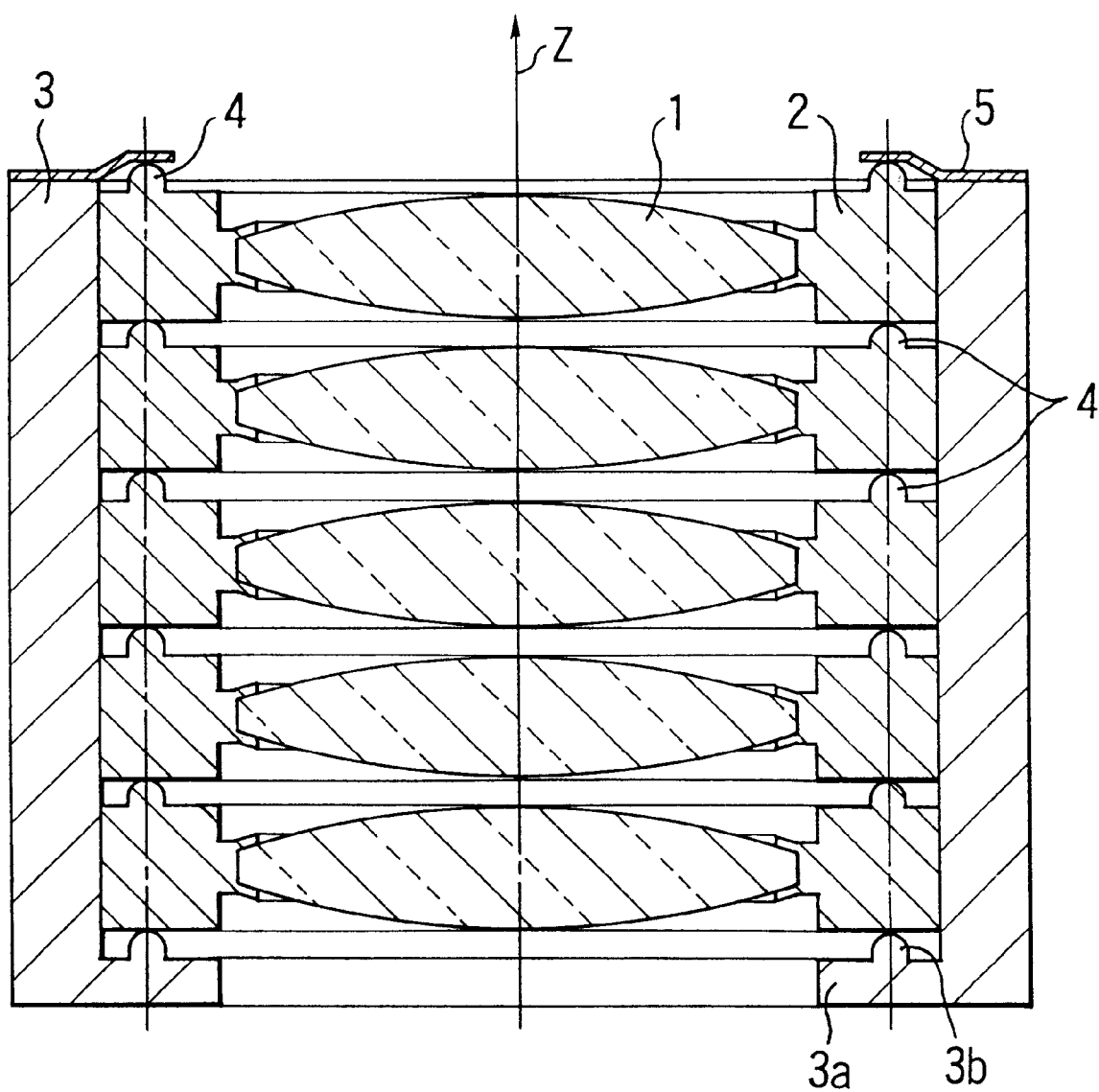
FIG. 1 is a sectional view showing a lens supporting device arranged according to a first embodiment of the invention.
Figure 2:
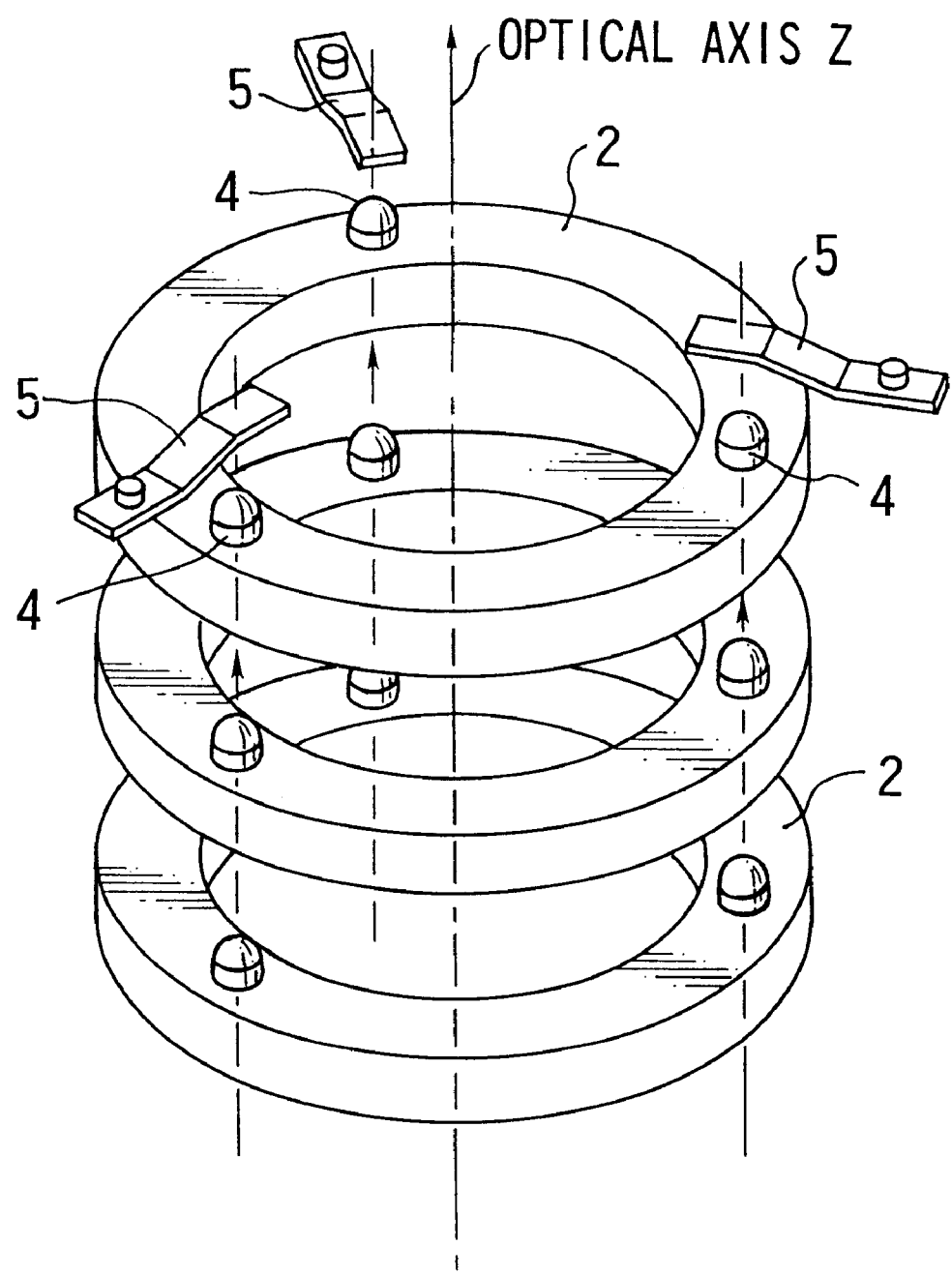
FIG. 2 is a perspective view showing essential parts of the lens supporting device according to the first embodiment.

FIGS. 1 and 2 show a lens supporting device (optical-element supporting device) for a refraction-type projecting optical system, according to a first embodiment of the invention. In FIGS. 1 and 2, reference symbol Z denotes an optical axis. The direction of gravitation can be expressed as −Z. The lens supporting device is adapted for use in an optical apparatus such as a stepper or the like for manufacturing a semiconductor device such as a semiconductor chip.

Referring to FIGS. 1 and 2, lenses 1 constitute the refraction-type projecting optical system. Each of ring frames 2 (holding members) is mounted on the peripheral part of the lens 1 so as to hold the lens 1. The lens 1 is held, by caulking, at the inner circular edge part of the ring frame 2 in such a way as to have a prescribed degree of coaxial state. Further, each of the ring frames 2 has three projections 4 which protrude in the optical axis direction from its upper surface at three parts evenly spaced circumferentially at intervals of an angle of 120 degrees.

Figure 3:
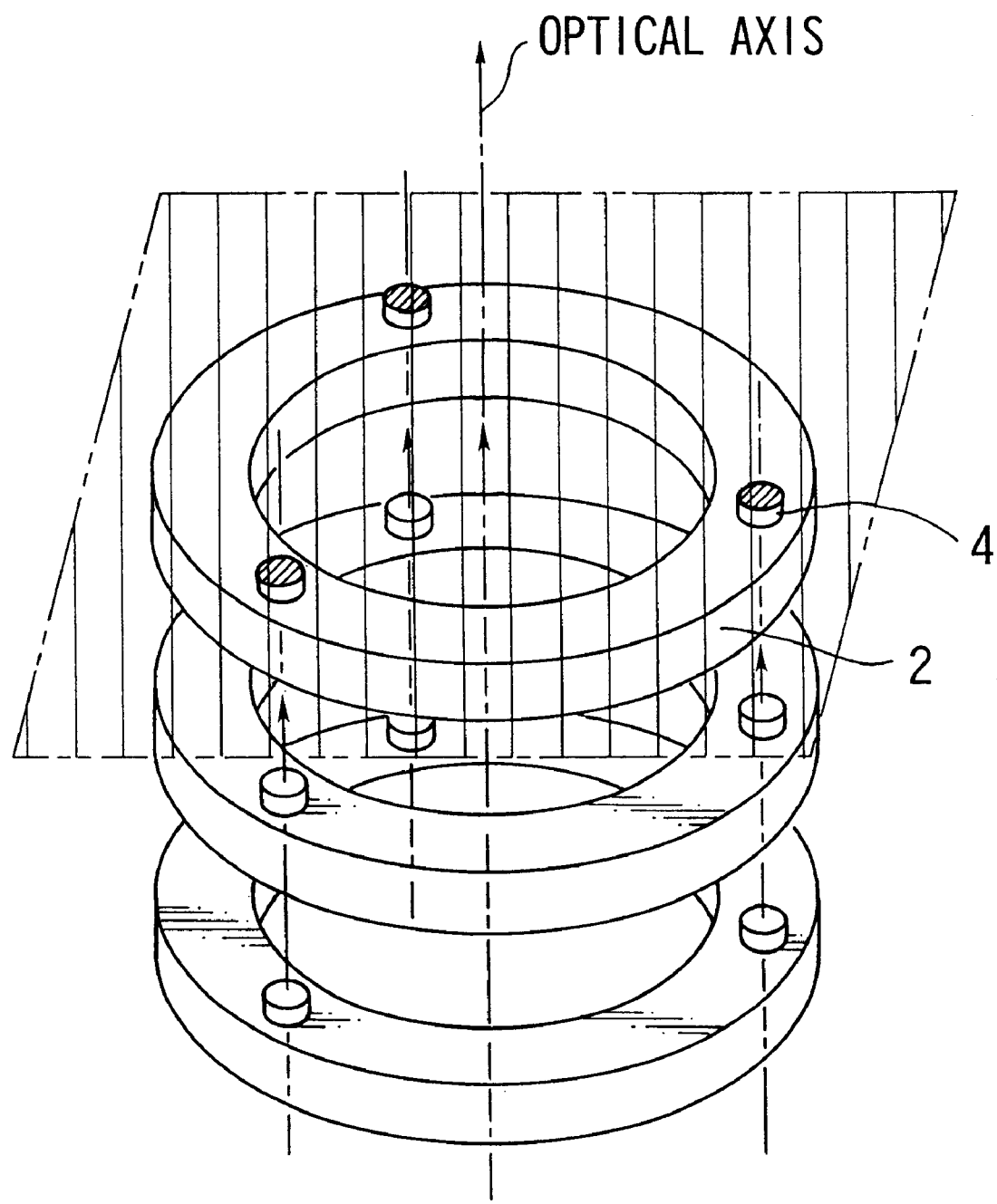
FIG. 3 is a perspective view showing by way of example a modification of the first embodiment.

The plurality of ring frames 2 are accommodated inside a lens barrel member 3 in a state of being piled up in the optical axis direction. In this state, the projections 4 provided on the ring frames 2 are aligned in the directions Z in parallel with the optical axis. Each ring frame 2 is in contact with another ring frame 2 only at the three projections 4. The contact parts of the ring frames 2 are thus aligned on three axes which are in parallel with the optical axis. The ring frames 2 are arranged to have a sufficient strength to prevent them from being deformed by their own weight in their parts other than the contact parts. For minimizing their contact areas and ensuring adequate strength, the projections 4 are preferably arranged to have their tips formed in a semispherical shape. The tips of the projections 4 may be formed in a flat shape to have very small contact areas as shown in FIG. 3. In such a case, these tips of the projections 4 must be arranged to be on one and the same plane which is perpendicular to the optical axis.

The outer circumferential part of each of the ring frames 2 is fitted into the inner circular wall of the lens barrel member 3, so that the plurality of lenses 1 can be coaxially arranged with a prescribed degree of precision.

The lens barrel member 3 is provided with a bracket part 3a which extends radially inward from the bottom end of the lens barrel member 3. The bracket part 3a is provided with projections 3b which protrude in the optical axis direction from the upper surface of the bracket part 3a at three parts evenly spaced circumferentially. The lower surface of the lowermost of the ring frames 2 is in contact with the projections 3b of the bracket part 3a. The bracket part 3a is thus arranged to prevent the ring frames 2 from coming off the inside of the lens barrel member 3. The ring frames 2 are set within the lens barrel member 3 in such positions where the projections 4 of the ring frames 2 are coaxial respectively with the three projections 3b of the bracket part 3a.

Leaf springs 5 are attached with bolts to the upper end surface (end surface in the optical axis direction) of the lens barrel member 3 at three parts evenly spaced circumferentially. The leaf springs 5 are thus arranged to be in contact with the projections 4 of the uppermost of the ring frames 2 in such a way as to push them downward with a prescribed spring force. All the ring frames 2 are thus pinched and fixed in position between the leaf springs 5 and the projections 3b of the lens barrel member 3. In other words, the positions where the leaf springs 5 are in contact with the uppermost ring frame 2 are coaxial respectively with the projections 4 of the ring frames 2.

With the lens supporting device arranged as described above, each of the ring frames 2 is in contact and held at a total of six points, i.e., upper three points and lower three points. However, a straight line connecting upper and lower confronting two contact points of each ring frame 2 coincides with the direction in which the pushing force of the leaf spring 5 is acting. In respect to deformation, therefore, the ring frames 2 can be considered to be supported at three points. Even in the event of such a large pushing force that tends to deform the lenses of the conventional device, the ring frames 2 can be kept within the lens barrel member 3 without causing any deformation of the lenses 1.

Further, the contact of one ring frame 2 with another and the contact of the uppermost or lowermost ring frame 2 with the lens barrel member 3 or the leaf spring 5 are effected only at three parts. Compared with a case where these parts are arranged to be in contact with each other over their whole periphery, any deforming force on the lens barrel member 3 is less readily transmitted to the ring frames 2. Therefore, any deformation of the lens barrel member 3 caused by a change of temperature or by an external force can be reliably prevented from being transmitted to the lenses 1.

In the case of the conventional supporting device described in the foregoing, a lens pushing force must be controlled by the torque of tightening each retaining ring. According to the arrangement of the supporting device in the first embodiment of the invention, on the other hand, a lens pushing force can be controlled simply by adjusting only the amount of deformation of the leaf springs 5. The arrangement of the first embodiment thus enhances the productivity of a lens supporting device and an assembly reproducibility of the lens supporting device.

Another advantage of the first embodiment lies in the following point. With respect to the amount of deformation of each of the leaf springs 5 required for obtaining a force necessary in pinching the lenses 1 and the ring frames 2, the leaf spring 5 is deformed within an elastic deformable range to some excessive degree beforehand. With the lens supporting device arranged to be in this state, even in cases where the ring frames 2 and the lens barrel member 3 are caused by a change of temperature or the like to shrink relative to each other to an extent corresponding to the excessive amount of the elastic deformation, the leaf springs 5 can retain a spring force necessary for pinching the ring frames 2.

In other words, relative contraction amounts of the ring frames 2 and the lens barrel member 3 are calculated on the basis of expected changes of the optical system due to temperature variations and a difference between an expansion coefficient of the ring frames 2 and that of the lens barrel member 3. The leaf springs 5 are designed with the result of that calculation taken into consideration. With the leaf springs 5 designed in this manner, the optical characteristic of the lens supporting device can be stabilized by preventing any positional deviation of the lenses 1 within the lens barrel member 3 from being caused by a change in temperature or the like.

Figure 4:
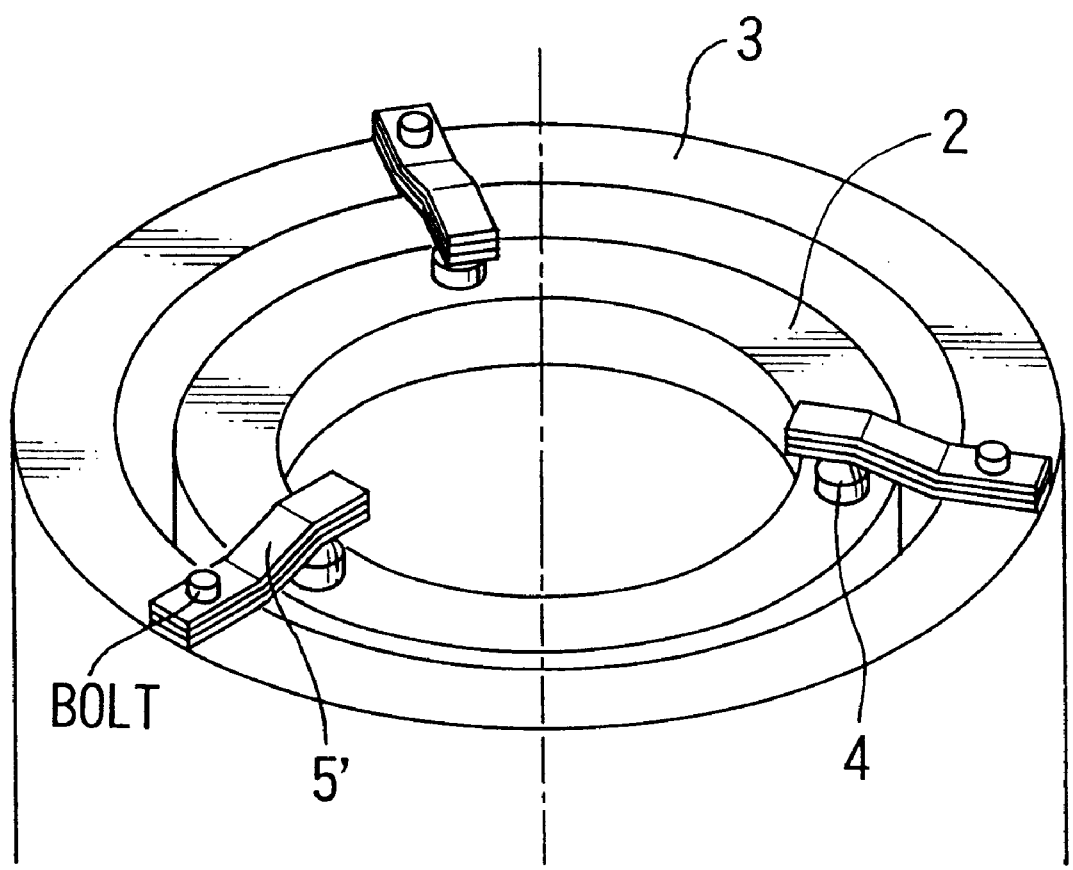
FIG. 4 is a perspective view showing another modification of the first embodiment.

In a case where a greater spring force is necessary for pinching the ring frames 2, the spring force can be easily increased within a range not exceeding the elastic range of each leaf spring, by arranging a plurality of leaf springs 5' piled up as shown in FIG. 4.

Further, while the first embodiment is arranged to have the projections 4 on the upper surfaces of the ring frames 2, the arrangement may be changed to have the projections 4 either only on the lower surfaces or on both the upper and lower surfaces of the ring frames 2.

(Second Embodiment)

Figure 5:
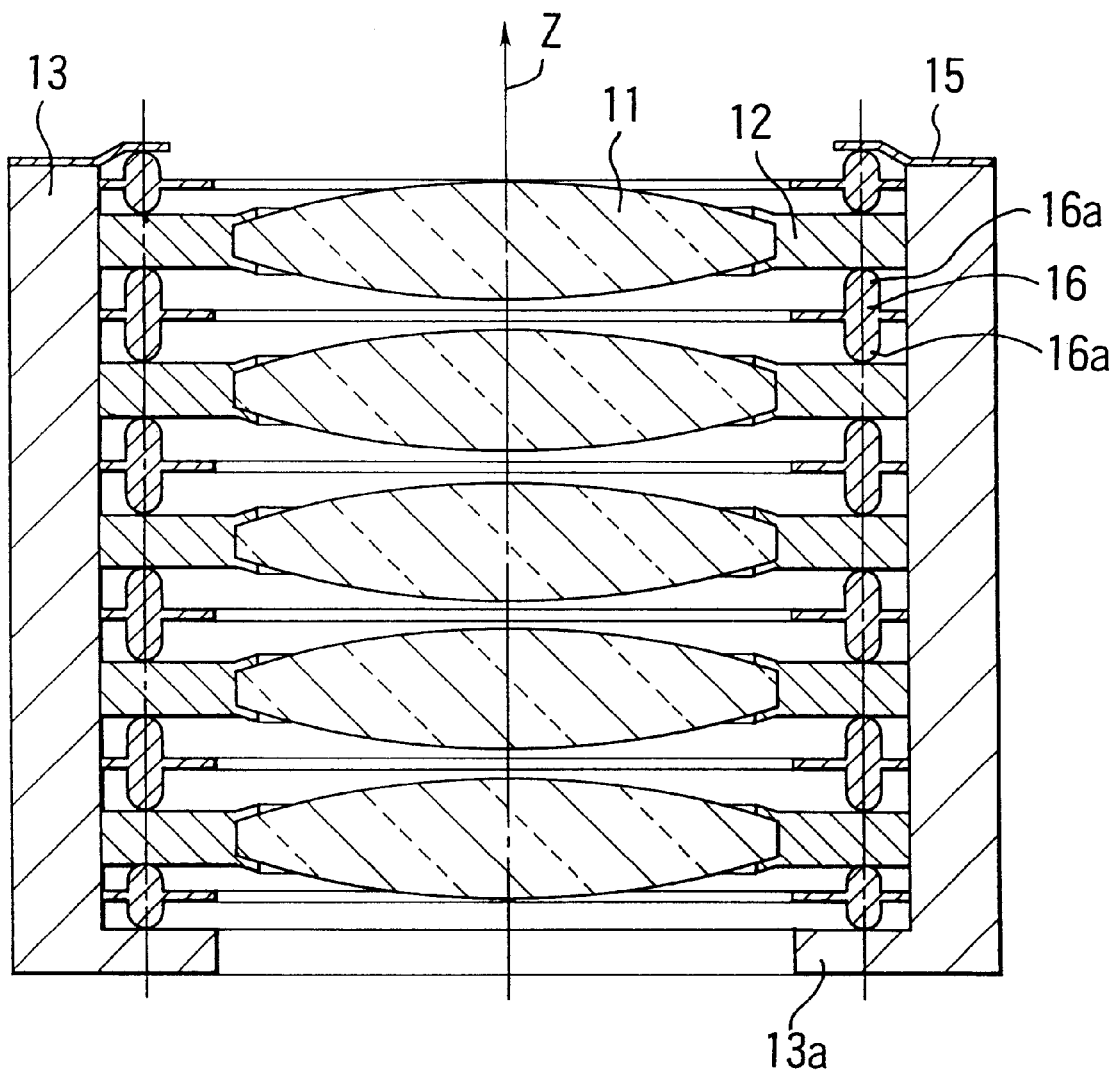
FIG. 5 is a sectional view showing a lens supporting device arranged according to a second embodiment of the invention.

FIG. 5 shows the configuration of a lens supporting device for a refraction-type projecting optical system, according to a second embodiment of the invention. In FIG. 5, reference symbol Z denotes an optical axis. The direction of gravitation can be expressed as −Z. The lens supporting device is adapted for an optical apparatus such as a stepper or the like to be used for manufacturing a semiconductor device such as a semiconductor chip.

Referring to FIG. 5, lenses 11 constitute the refraction-type projecting optical system. Ring frames 12 (holding members) are mounted on the peripheral parts of the lenses 11 so as to hold the lenses 11. The lenses 11 are held, by caulking, at the inner circular edge parts of the ring frames 12 in such a way as to have a prescribed degree of coaxial state.

A lens barrel member 13 is arranged to house therein the ring frames 12 and a plurality of ring-shaped spacer members 16 in such a manner that the ring frames 12 and the plurality of ring-shaped spacer members 16 are alternately piled up in the optical axis direction. Each of the spacer members 16 has projections 16a which protrude in the optical axis direction from its upper and lower surfaces at three parts evenly spaced circumferentially at intervals of an angle of 120 degrees. The parts of the spacer member 16 where the projections 16a are formed on its upper surface are the same as the parts where the projections 16a are formed on its lower surface. The projections 16a of the spacer members 16 are aligned in directions which are parallel with the optical axis direction. The ring frames 12 are thus separated from each other by the spacer members 16. Each of the ring frames 12 and each of the spacer members 16 are thus arranged to be in contact with each other through the projections 16a only at three parts. All the contact parts are thus aligned on three axes in parallel with the optical axis.

The ring frames 12 are arranged to have a sufficient strength to prevent them from being deformed by their own weight in their parts other than the contact parts. The tips of the projections 16a may be formed either in a semispherical shape or in a flat shape to have very small contact areas in the same manner as the projections 4 in the first embodiment.

The outer circumferential part of each of the ring frames 12 is fitted into the inner circular wall of the lens barrel member 13, so that the plurality of lenses 11 can be coaxially arranged with a prescribed degree of precision.

The lens barrel member 13 is provided with a bracket part 13a which extends radially inward from the bottom end of the lens barrel member 13. The bracket part 13a is in contact with the projections 16a of the lowermost spacer member 16 and is arranged to prevent the ring frames 12 from coming off the inside of the lens barrel member 13.

Leaf springs 15 are attached with bolts to the upper end surface (end surface in the optical axis direction) of the lens barrel member 13 at three parts evenly spaced circumferentially. The leaf springs 15 are arranged to be in contact with the projections 16a of the spacer member 16 which is located uppermost among the ring frames 12 and the spacer members 16 disposed within the lens barrel 13, and are arranged to push the uppermost projections 16a downward with a prescribed spring force. All the ring frames 12 and the spacer members 16 are thus pinched and fixed in position between the leaf springs 15 and the bracket part 13a of the lens barrel member 13. In other words, the positions where the leaf springs 15 are in contact with ring frames 12 through the projections 16a of the uppermost spacer member 16 are coaxial with the projections 16a of the spacer members 16.

With the lens supporting device arranged in this manner, each of the ring frames 12 is in contact and held at a total of six points, i.e., upper three points and lower three points. However, a straight line connecting upper and lower confronting two contact points of each ring frame 12 coincides with the direction in which the pushing force of the leaf spring 15 is acting. In respect to deformation, therefore, the ring frames 12 can be considered to be supported at three points. Even in the event of such a large pushing force that tends to deform the lenses of the conventional device, the ring frames 12 in the second embodiment can be kept within the lens barrel member 13 without causing any deformation of the lenses 11.

Further, the contact of one ring frame 12 with another and the contact of the uppermost or lowermost ring frame 12 with the lens barrel member 13 or the leaf spring 15 are effected only at three parts. Compared with a case where these parts are arranged to be in contact with one another over their whole periphery, any deforming force on the lens barrel member 13 is less readily transmitted to the ring frames 12. Therefore, any deformation of the lens barrel member 13 caused by a change of temperature or by an external force can be reliably prevented from being transmitted to the lenses 11.

Similarly to the case of the first embodiment, the arrangement of the second embodiment also permits easy control over a lens pushing force simply by adjusting only the amount of deformation of the leaf springs 15. The arrangement of the second embodiment thus enhances the productivity of a lens supporting device and an assembly reproducibility of the lens supporting device.

Further, as in the first embodiment, with the relative contraction amounts of the ring frames 12, the spacer members 16 and the lens barrel member 13 calculated beforehand, the leaf springs 15 are designed by taking into consideration the result of that calculation. The leaf springs 15 designed in this manner effectively prevent positional deviations of the lenses 11 due to changes in temperature, so that the lens supporting device can be arranged to have stable optical characteristics.

In the case of the second embodiment, a spacing interval between the lenses can be easily adjusted by forming beforehand the spacer members 16 in several kinds having different heights of upper and lower projections. The second embodiment, therefore, permits adjustment to be more easily carried out in assembling the optical system.

(Third Embodiment)

Figure 6:
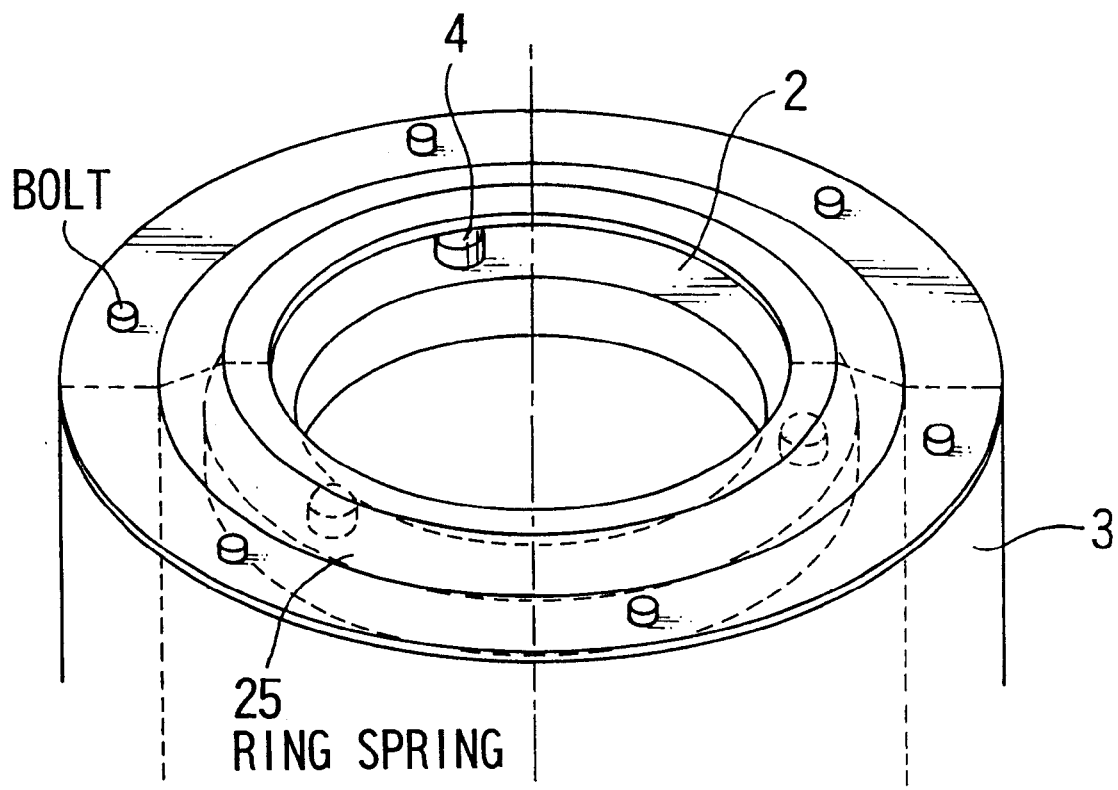
FIG. 6 is a perspective view showing a lens supporting device arranged to a third embodiment of the invention.
Figure 7:
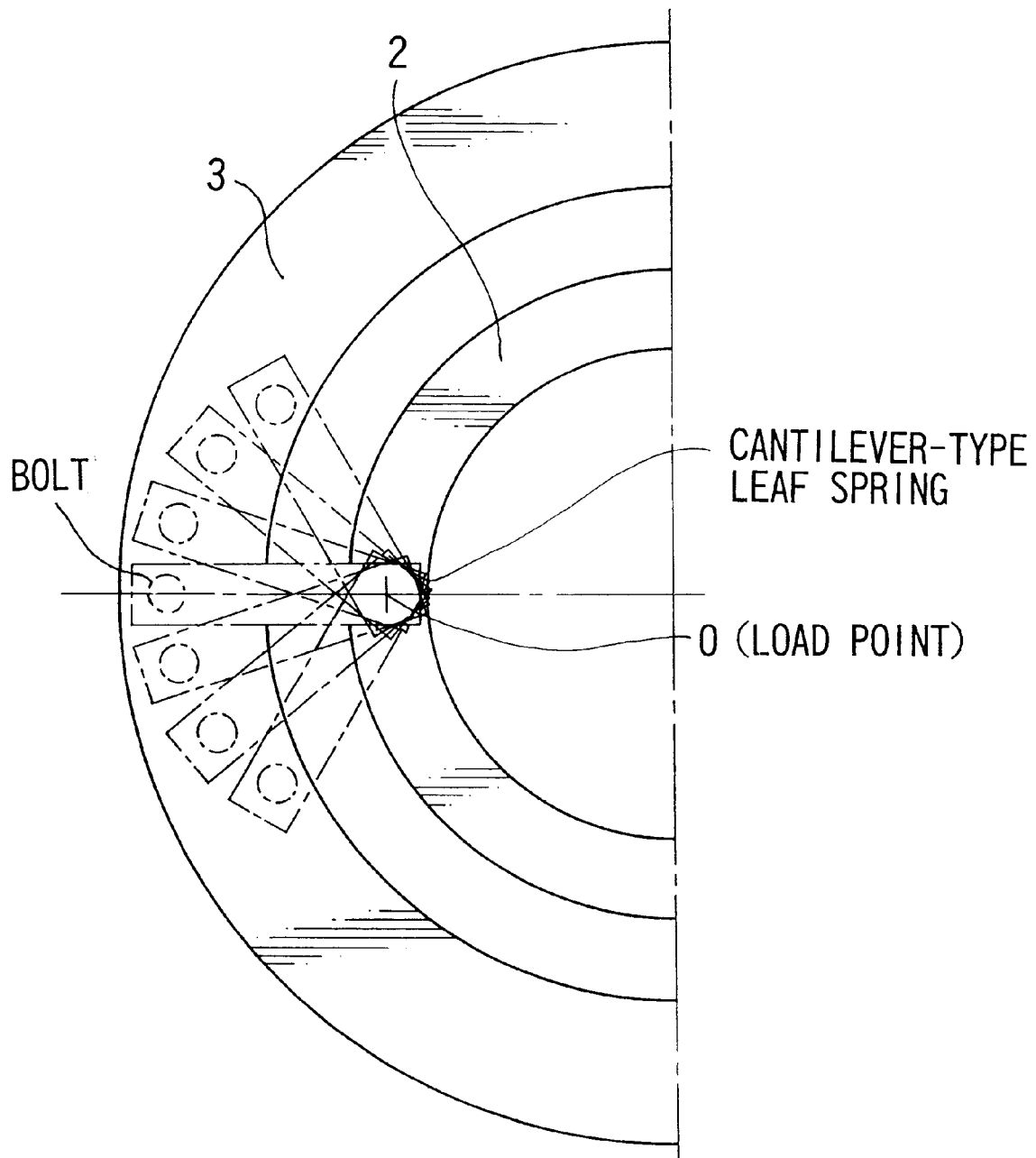
FIG. 7 shows an approximate model of the third embodiment.
Figure 8:
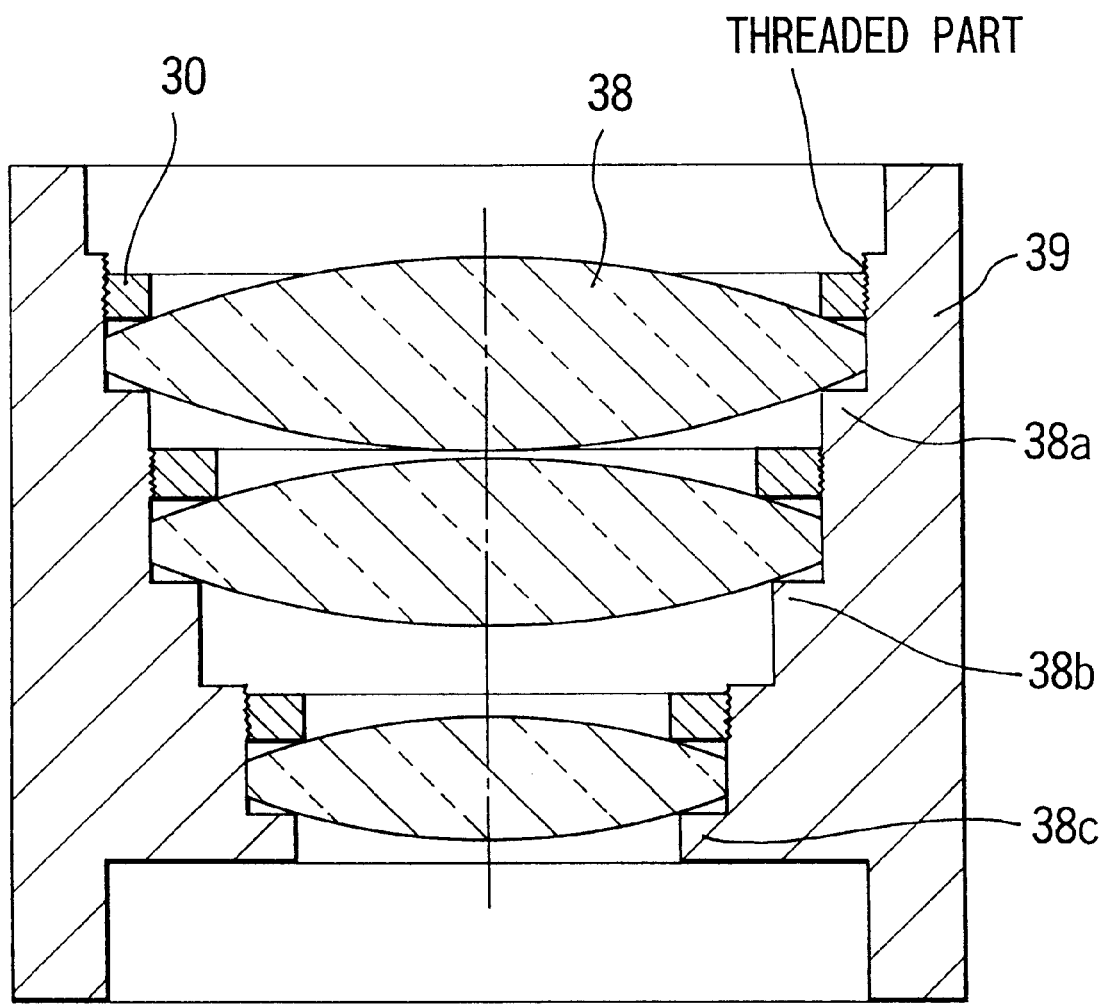
FIG. 8 is a sectional view showing the configuration of the conventional lens supporting device.

FIGS. 6 and 7 show a lens supporting device for a refraction-type projecting optical system, according to a third embodiment of the invention. The third embodiment is about the same as the first embodiment in respect of the arrangement and application. Therefore, all the component elements of the third embodiment that are the same as those of the first embodiment are indicated by the same reference numerals used in the first embodiment.

The third embodiment differs from the first embodiment in that a leaf spring 25 which is formed in a ring-shape or annular-shape is mounted on the upper end surface of the lens barrel member 3 in place of the cantilever-type leaf springs 5 used in the first embodiment.

In the case of the third embodiment, the use of the ring-shaped leaf spring 25 gives the approximately same advantageous effect attainable by a model wherein a plurality of cantilever-type leaf springs are radially arranged on a spring load point "O", as shown in FIG. 7, in place of each of the three leaf springs 5. Therefore, compared with the single use of each of the cantilever-type leaf springs 5, as in the case of the first embodiment, the arrangement of the third embodiment gives a greater spring force with these leaf springs assumed to be made of the same material, to have the same plate thickness and to have the same amount of deformation.

In addition, the ring-shaped or annular-shaped leaf spring 25 is usable also for the second embodiment.

According to the arrangement of each of the embodiments described above, optical elements (lenses) can be supported without deforming them even in cases where the lens barrel member is deformed by a change in temperature or by an external force or where a setting amount of the pinching force becomes excessively large.

According to the invention, in a case where a pinching means is to be formed by mounting a retaining member on a lens barrel member, the retaining means is made of a spring material and is arranged to have its initial amount of deformation adjusted in such a way as to retain a necessary pinching force even when the lens barrel member and the holding means are caused by changes in temperature to expand or contract relative to each other in the optical axis direction. Therefore, with an optical-element supporting device arranged according to the invention, lenses can be prevented from being caused to deviate from their positions by changes of temperature, so that the optical characteristics of these optical elements can be retained at predetermined levels.

An optical apparatus such as a stepper, or a method for manufacturing a semiconductor device, in which an optical-element supporting device is arranged according to the invention, as disclosed in the foregoing, has little fluctuations of optical characteristics resulting from deformation of optical elements.

We claim:

1. An optical-element supporting device for supporting a plurality of optical elements in respective predetermined positions in an optical axis direction, said optical-element supporting device comprising:
holding members each having a plurality of projections protruding in the optical axis direction and holding the optical elements; and
pinching means for pinching said holding members being piled up in the optical axis direction,
wherein said projections of said holding members and pinching positions of said pinching means are axially aligned in parallel with the optical axis direction.

2. An optical-element supporting device according to claim 1, wherein said projections and said pinching positions are provided at three parts spaced circumferentially on each of said holding members.

3. An optical-element supporting device according to claim 1, wherein said pinching means comprises a lens barrel member which accommodates said holding members, and a retaining member mounted near an end part of said lens barrel member in the optical axis direction.

4. An optical-element supporting device according to claim 2, wherein said pinching means comprises a lens barrel member which accommodates said holding members, and a retaining member mounted near an end part of said lens barrel member in the optical axis direction.

5. An optical-element supporting device according to claim 3, wherein said retaining member is made of a spring material.

6. An optical-element supporting device according to claim 4, wherein said retaining member is made of a spring material.

7. An optical-element supporting device for supporting a plurality of optical elements in respective positions in an optical axis direction, said optical-element supporting device comprising:
holding members for holding the plurality of optical elements;
spacer members piled up alternatively with said holding members in the optical axis direction and having a plurality of projections protruding from both sides of said spacer members in the optical axis direction; and
pinching means for pinching said holding members and said spacer members,
wherein said projections of said spacer members and pinching positions of said pinching means are axially aligned in parallel with the optical axis direction.

8. An optical-element supporting device according to claim 7, wherein said projections and said pinching positions are provided at three parts spaced circumferentially on each of said holding members.

9. An optical-element supporting device according to claim 7, wherein said pinching means comprises a lens barrel member which accommodates said holding members, and a retaining member mounted near an end part of said lens barrel member in the optical axis direction.

10. An optical-element supporting device according to claim 8, wherein said pinching means comprises a lens barrel member which accommodates said holding members, and a retaining member mounted near an end part of said lens barrel member in the optical axis direction.

11. An optical-element supporting device according to claim 9, wherein said retaining member is made of a spring material.

12. An optical-element supporting device according to claim 10, wherein said retaining member is made of a spring material.

13. An optical apparatus having said optical-element supporting device according to one of claims 1 to 12.

14. An optical apparatus according to claim 13, wherein said optical apparatus is an apparatus for manufacturing a semiconductor device.

15. A method of manufacturing a semiconductor device by using said optical apparatus according to claim 14.

16. An optical-element supporting device for supporting an optical element in a predetermined position in an optical axis direction, said optical element supporting device comprising:

a holding member for holding the optical element and having a plurality of projections protruding in the optical axis direction; and pinching means for pinching said holding member in the optical axis direction, wherein said projections of said holding member and pinching positions of said pinching means are axially aligned in parallel with the optical axis direction.

17. An optical-element supporting device for supporting an optical element in a predetermined position in an optical axis direction, said optical-element supporting device comprising:

a holding member for holding the optical element;

spacer members piled up alternatively with said holding member in the optical axis direction and having a plurality of projections protruding from both sides of said spacer members in the optical axis direction; and pinching means for pinching said holding member and said spacer members, wherein said projections of said spacer members and pinching positions of said pinching means are axially aligned in parallel with the optical axis direction.

* * * * *